(12) United States Patent
Oda et al.

(10) Patent No.: US 8,310,056 B2
(45) Date of Patent: Nov. 13, 2012

(54) SEMICONDUCTOR DEVICE

(75) Inventors: Noriaki Oda, Ibaraki (JP); Shinichi Chikaki, Ibaraki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 176 days.

(21) Appl. No.: 12/662,807

(22) Filed: May 4, 2010

(65) Prior Publication Data

US 2010/0301488 A1   Dec. 2, 2010

(30) Foreign Application Priority Data

May 29, 2009   (JP) ................................ 2009-131030

(51) Int. Cl.
*H01L 23/522* (2006.01)
(52) U.S. Cl. . 257/773; 257/758; 257/774; 257/E23.142; 257/E23.144; 257/E23.145; 257/E23.151; 257/E23.152
(58) Field of Classification Search ................. 257/773, 257/774, E23.142, E23.144, E23.145, E23.151, 257/E23.152
See application file for complete search history.

(56) References Cited

U.S. PATENT DOCUMENTS

| | | | |
|---|---|---|---|
| 6,900,541 B1 * | 5/2005 | Wang et al. | 257/758 |
| 7,253,531 B1 * | 8/2007 | Huang et al. | 257/784 |
| 7,304,385 B2 * | 12/2007 | Wang et al. | 257/758 |
| 7,397,125 B2 | 7/2008 | Oda | |
| 2001/0010408 A1 * | 8/2001 | Ker et al. | 257/781 |
| 2004/0150112 A1 | 8/2004 | Oda | |
| 2008/0088023 A1 | 4/2008 | Oda | |
| 2008/0290516 A1 | 11/2008 | Oda | |

FOREIGN PATENT DOCUMENTS

| | | |
|---|---|---|
| JP | 2004-235416 A | 8/2004 |
| WO | WO2005/096364 A1 | 10/2005 |

* cited by examiner

*Primary Examiner* — Peniel M Gumedzoe
(74) *Attorney, Agent, or Firm* — McGinn IP Law Group, PLLC

(57) ABSTRACT

In a semiconductor device, a lower multi-layered interconnect structure, an intermediate via-level insulating interlayer, and an upper multi-layered interconnect structure are stacked in this order in a region overlapped with a bonding pad in a plan view; upper interconnects and vias of the upper multi-layered interconnect structure are formed so as to be connected to the bonding pad in the pad placement region; the intermediate via-level insulating interlayer has no electro-conductive material layer, which connect the interconnects or vias in the upper multi-layered interconnect structure with interconnects or vias in the lower multi-layered interconnect structure, formed therein; and the ratio of area occupied by the vias in the via-level insulating interlayers contained in the lower multi-layered interconnect structure is smaller than the ratio of area occupied by the vias in the via-level insulating interlayers contained in the upper multi-layered interconnect structure.

20 Claims, 10 Drawing Sheets

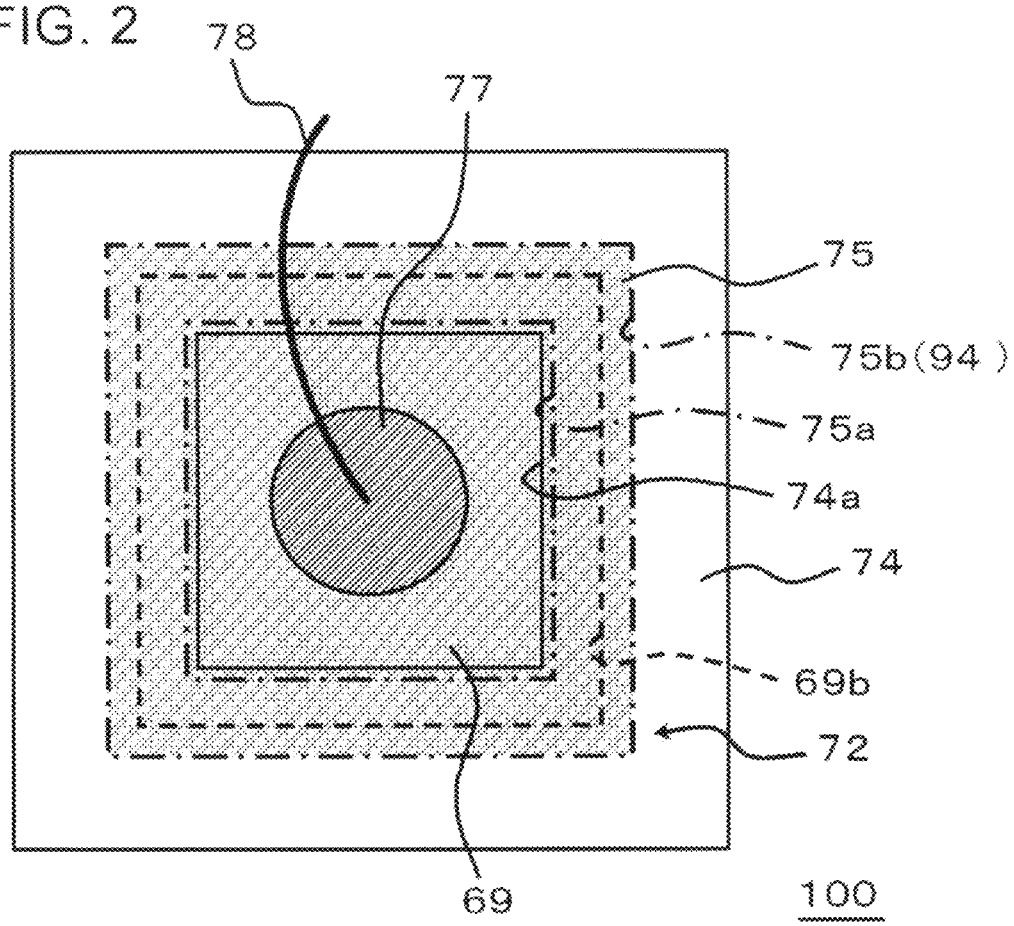

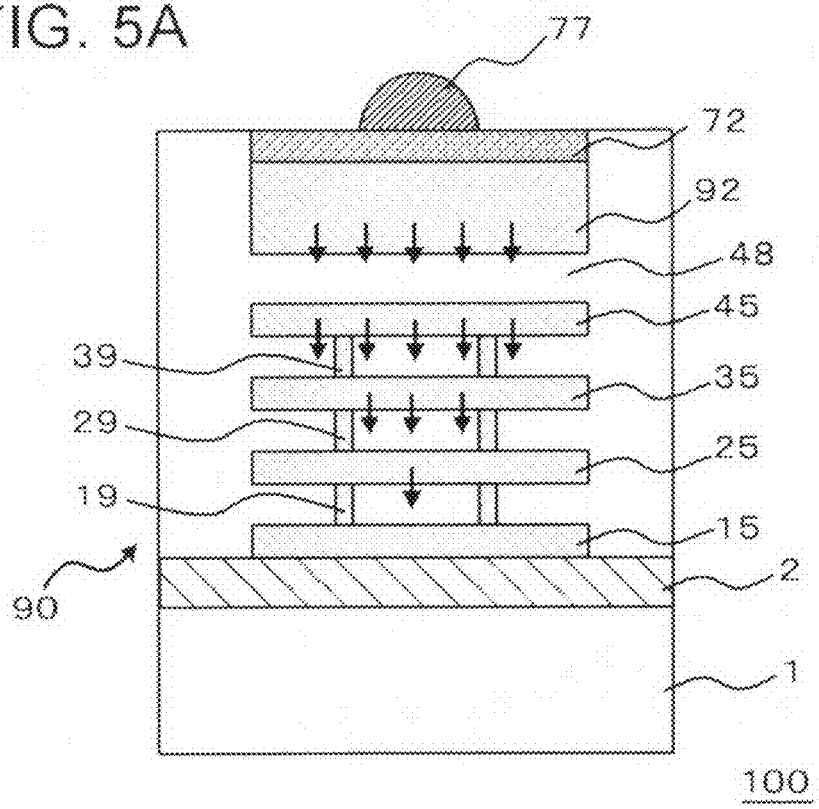
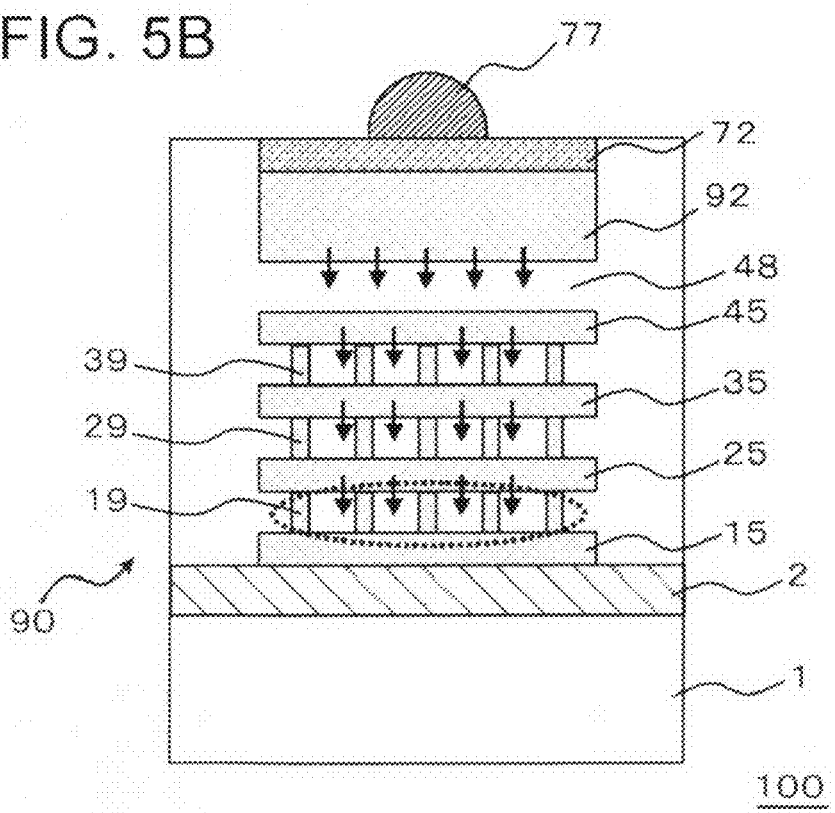

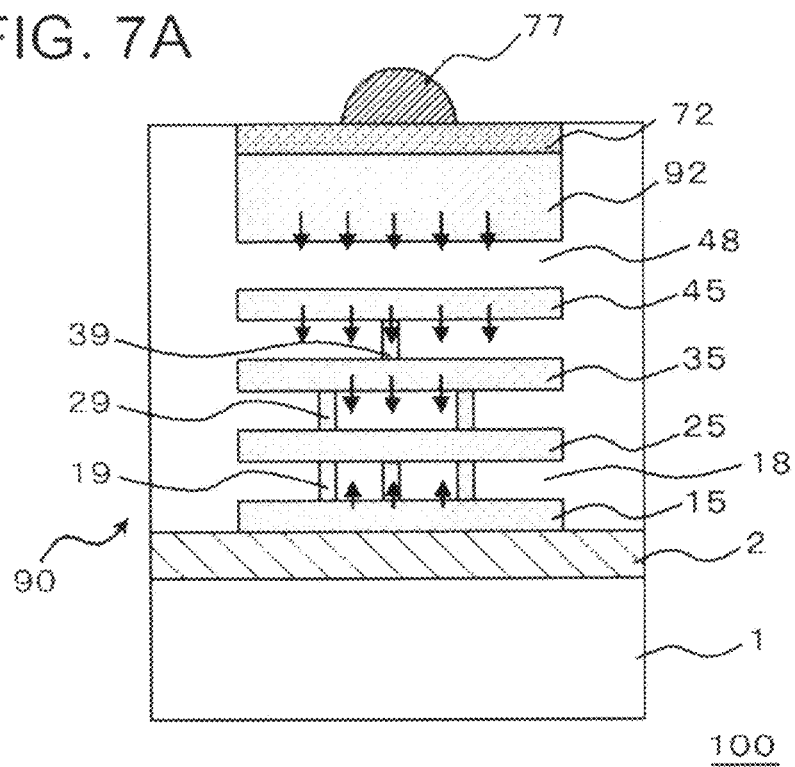
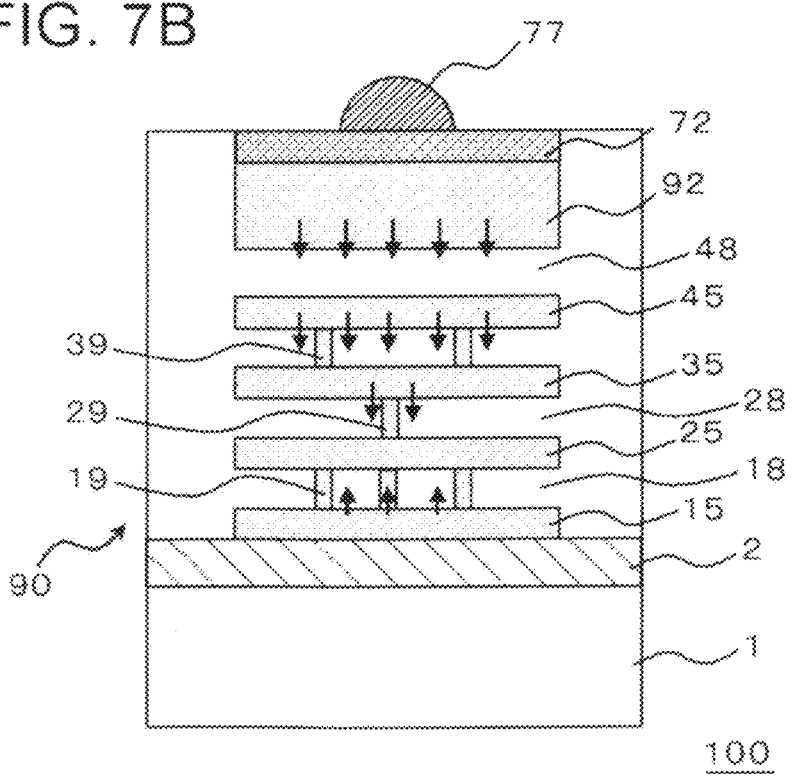

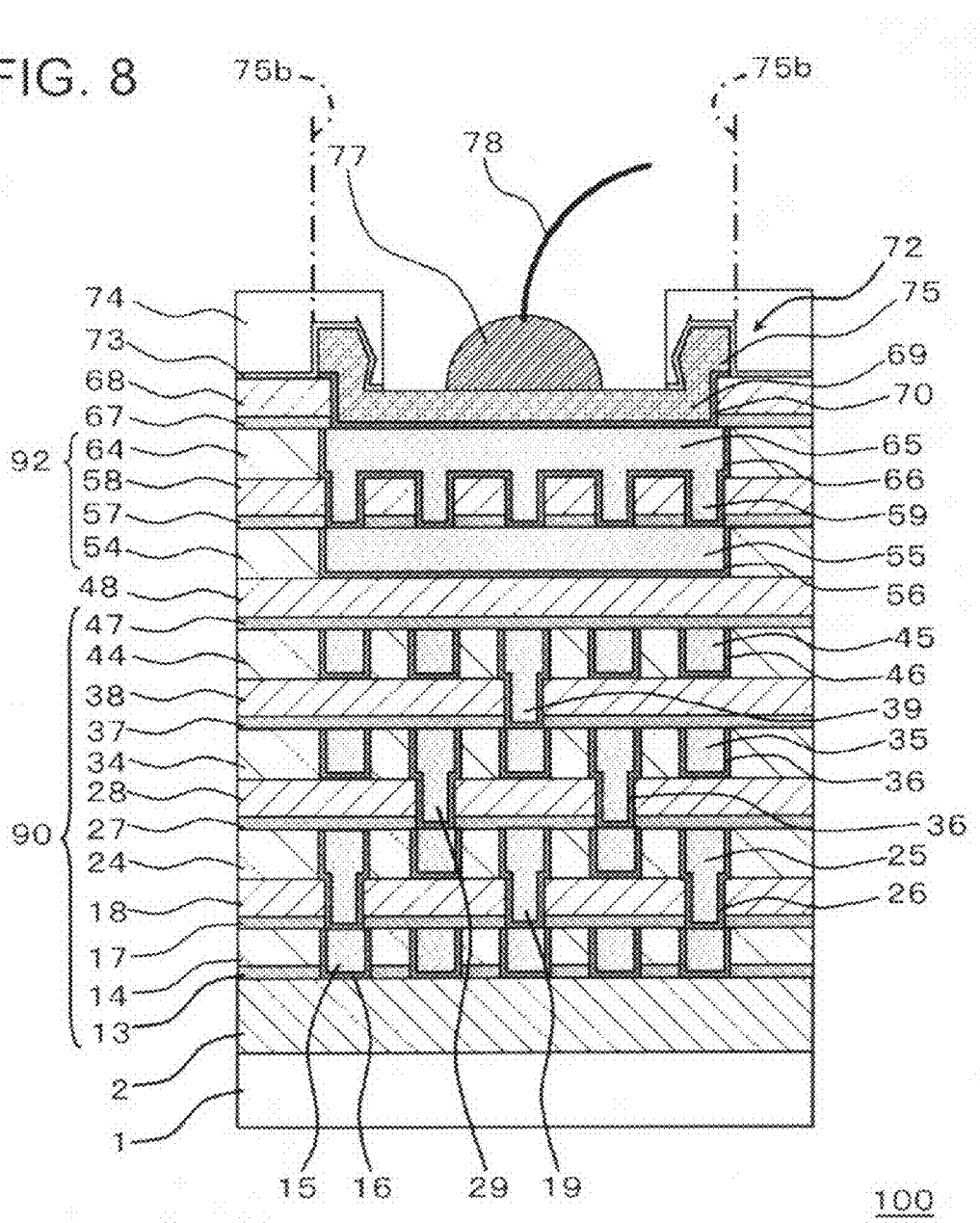

SEMICONDUCTOR DEVICE

This application is based on Japanese patent application No. 2009-131030, the content of which is incorporated hereinto by reference.

BACKGROUND

1. Technical Field

The present invention relates to a semiconductor device, and in particular to a semiconductor device having pads, such as bonding pads, provided over a substrate.

2. Related Art

In recent years, low-dielectric-constant insulating film (low-k film), typically having a dielectric constant (k-value) of 2.7 or smaller, has increasingly been used for insulating interlayers in multi-layered interconnect structures. However, the low-k film is generally poor in mechanical strength. There has therefore been a problem in that the insulating interlayer may cause crack or separation when the bonding pads are applied with load in the process of wire bonding, probing and so forth, and thereby yield of the final products tends to degrade.

International Patent publication No. WO2005/096364 describes a semiconductor device which uses the low-dielectric-constant insulating interlayer having poor strength and adhesiveness, configured so that a large number of reinforcing via patterns, not electrically connected to a circuit, are formed in a region where reinforcing interconnect patterns formed in the upper and lower interconnect layers overlap with each other, so as to connect the reinforcing interconnect patterns with each other. According to the description, the separation or rupture of films in the manufacturing process or packaging may be suppressible, by virtue of increased structural strength.

Japanese Laid-Open Patent Publication No. 2004-235416 describes a semiconductor device having bonding pads formed on a semiconductor substrate; an upper copper interconnect layer formed below the bonding pads, and having a ratio of area of copper larger than that of a layer in which circuit interconnects are formed; and a lower copper interconnect layer electrically isolated from the upper copper interconnect layer, and formed more closer to the semiconductor substrate than the upper copper interconnect layer is.

SUMMARY

According to the description of Japanese Laid-Open Patent Publication No. 2004-235416, by providing the upper copper interconnect layer having a large ratio of area of copper below the bonding pads, the load possibly applied to the insulating film such as low-k film is supposed to be moderated in the process of probing or wire bonding, and thereby the layer structure is improved in the resistance against impact on the bonding pad. However, with recent shrinkage of inter-pad pitch in advanced generations of LSI, also the diameter of bonding wires shrinks. There is, therefore, a tendency of increase in the load per unit area in the bonding process. Accordingly, in particular under an increased compositional ratio of the low-k film, the impact applied to the bonding pads cannot occasionally be absorbed to a satisfactory degree, solely by the upper copper interconnect layer having a large ratio of area of copper, provided below the bonding pad. It this case, it is anticipated that separation of the insulating interlayers may occur in the lower layers so as to deform the layer structure, and thereby incidence of separation of the bonding pads may increase.

According to the present invention, there is provided a semiconductor device which includes:

a substrate;

a multi-layered interconnect structure formed over the substrate, and containing insulating interlayers composed of a low-k film at least in a part of the layers; and a pad formed over the multi-layered interconnect structure over the substrate, the multi-layered interconnect structure further comprising:

a lower multi-layered interconnect structure having, stacked therein, an interconnect-level insulating interlayer which contains an interconnect formed in a region overlapped with the pad in a plan view, and a via-level insulating interlayer which contains a via formed in a region overlapped with the pad in a plan view;

an upper multi-layered interconnect structure having, stacked therein, an interconnect-level insulating interlayer which contains an interconnect formed in a region overlapped with the pad in a plan view, and a via-level insulating interlayer which contains a via formed in a region overlapped with the pad in a plan view, formed over the lower multi-layered interconnect structure; and an intermediate insulating film formed between the lower multi-layered interconnect structure and the upper multi-layered interconnect structure, In a region overlapped with the pad in a plan view, the interconnect and the via in the upper multi-layered interconnect structure are formed so as to be electrically connected with the pad.

In the region overlapped with the pad in a plan view, the intermediate insulating film has, formed therein, no electroconductive material layer which connects the interconnect or the via in the upper multi-layered interconnect structure, with the interconnect or the via in the lower multi-layered interconnect structure, and In the region overlapped with the pad in a plan view, ratio of area occupied by the via in the via-level insulating interlayer contained in the lower multi-layered interconnect structure, is smaller than ratio of area occupied by the via in the via-level insulating interlayer contained in the upper multi-layered interconnect structure.

Note that also all arbitrary combinations of the constituents described in the above, and all exchanges of expressions in the present invention made among of method, device and so forth, are valid as embodiments of the present invention.

BRIEF DESCRIPTION OF THE DRAWINGS

The above and other objects, advantages and features of the present invention will be more apparent from the following description of a certain preferred embodiment taken in conjunction with the accompanying drawings, in which:

FIG. 2 is a plan view illustrating an exemplary configuration of a semiconductor device in one embodiment of the present invention;

FIGS. 5A and 5B are vertical sectional views illustrating an effect of the semiconductor device in one embodiment of the present invention;

FIGS. 7A and 7B are vertical sectional views illustrating other exemplary configurations of the semiconductor device in the embodiment of the present invention; and FIGS. 8 to 10 are vertical sectional views illustrating still other exemplary configurations of the semiconductor device in the embodiment of the present invention.

DETAILED DESCRIPTION

Figure 1:
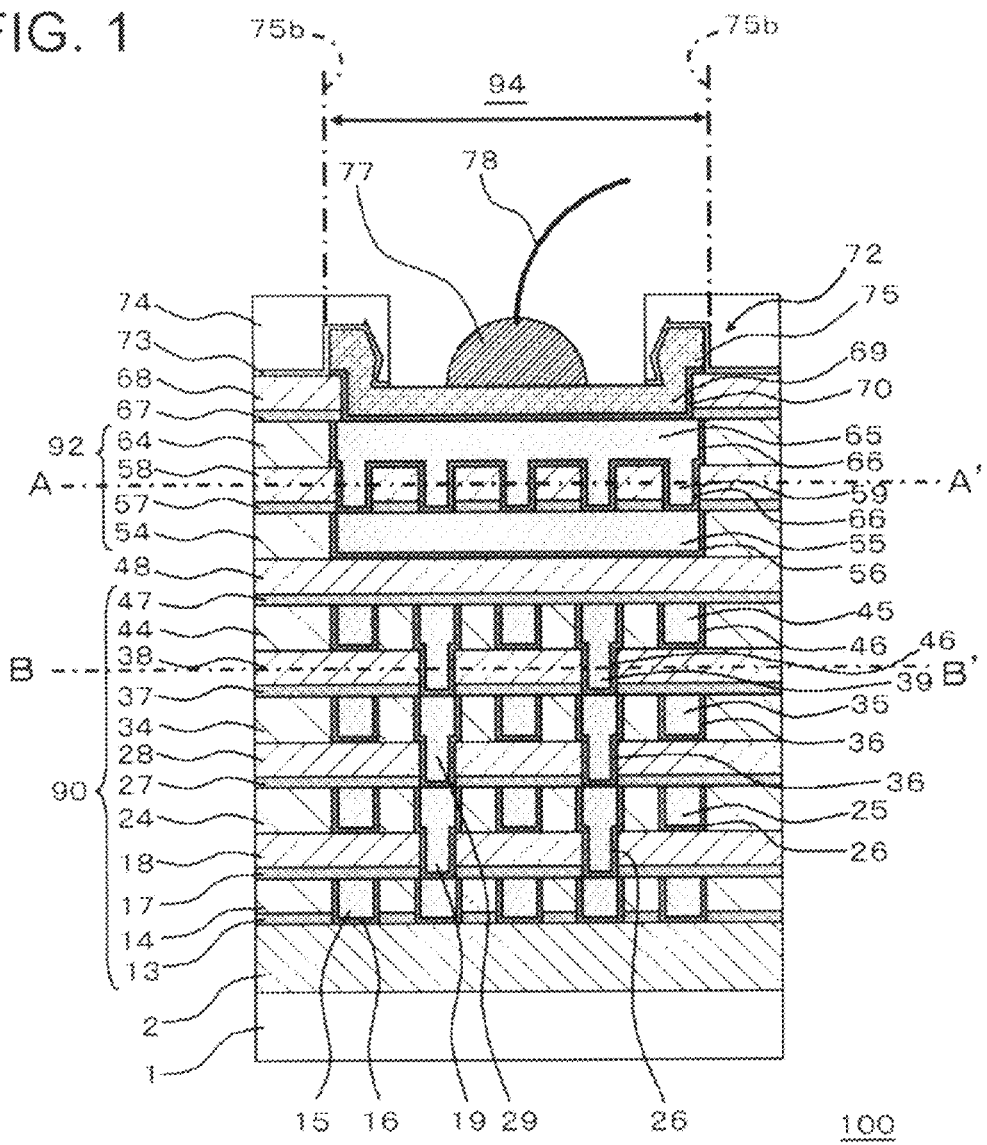
FIG. 1 is a vertical sectional view illustrating an exemplary configuration of a semiconductor device in one embodiment of the present invention.

The present inventors found out from our extensive investigations that the deformation of the layer structure typically due to separation of the insulating interlayers may successfully be avoidable, and thereby the incidence of separation of the bonding pads may be reduced, by configuring a semiconductor device so that the load applied to the bonding pads in the process of wire bonding or probing may gradually be absorbed by the insulating interlayers as it propagates towards the deeper side. In order to achieve the configuration, the present invention adopts the intermediate insulating film so as to separate the upper portion and the lower portion of the multi-layered interconnect structure, while setting different ratios of area occupied by the vias to the individual portions.

International Patent Publication No. WO2005/096364 describes the configuration having the reinforcing via patterns provided thereto, but pays no consideration, unlike the configuration of the present invention, on separation of the multi-layered interconnect structure into the upper and lower portions, while setting different ratios of area occupied by the vias to the individual portions. While Japanese Laid-Open Patent Publication No. 2004-235416 specifies the ratio of area occupied by the interconnects, again no consideration is paid on the vias. Accordingly, a problem has still remained in view of preventing the layer structure from being deformed typically due to separation of the insulating interlayers, and in view of suppressing the incidence of separation of the bonding pad to a low level.

According to the configuration of the present invention, the interconnects and vias, which are connected to the pad, are provided in the upper multi-layered interconnect structure in a region overlapped with the pad in a plan view. By virtue of this configuration, the strength of the upper multi-layered interconnect structure may be improved, and thereby the insulating interlayers may be prevented from causing cracks, even if applied with load in the process of probing or wire bonding. Moreover, the intermediate insulating film, which has no electro-conductive material layer formed therein, is provided below the upper multi-layered interconnect structure. Accordingly, any impact applied to the pad may be moderated by the intermediate insulating film, and thereby the resistance against impact may be improved to a certain extent. In addition, since the ratio of area occupied by the vias is set to a small value in the lower multi-layered interconnect structure formed below the intermediate insulating film, so that impact, which could not otherwise be absorbed by the upper multi-layered interconnect structure and the intermediate insulating film, may gradually be absorbed and moderated by the lower multi-layered interconnect structure as it propagates towards the deeper (lower) side. Accordingly, the incidence of separation of the insulating interlayers and the pads may be suppressed to a low level, and thereby yield of the final products may be improved.

According to the present invention, in the semiconductor device having the pads formed therein, the incidence of separation of the insulating interlayers and the pads may be suppressed to a low level, even the pads are applied with load, and thereby yield of the final products may be improved.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

An embodiment of the present invention will be explained referring to the attached drawings. Note that all similar constituents in all drawings are given similar reference numerals or symbols, explanations of which will not always necessarily be repeated.

FIG. 1 is a vertical sectional view illustrating an exemplary configuration of a semiconductor device of this embodiment, and FIG. 2 is a plan view illustrating an exemplary configuration of the semiconductor device of this embodiment.

A semiconductor device 100 contains a substrate 1, a multi-layered interconnect structure formed over the substrate, and a bonding pad 72 (pad) formed over the multi-layered interconnect structure. Since the semiconductor device 100 in this embodiment has a characteristic feature in a structure, in a region below the bonding pad 72 overlapped therewith in a plan view (referred to as "pad placement region 94", hereinafter), so that the drawing herein illustrates only the region having the bonding pad 72 formed therein.

Over the substrate 1, there is formed an insulating interlayer 2 which typically has transistors and so forth buried therein. The multi-layered interconnect structure is formed over the insulating interlayer 2. The insulating interlayer 2 herein may be configured by using a material having a relatively large mechanical strength, such as silicon oxide film. Although not illustrated herein, the insulating interlayer 2 has a plurality of contacts formed therein, through which diffusion layers in the substrate 1 are brought into contact with interconnects in the upper layer.

In this embodiment, the multi-layered interconnect structure formed over the insulating interlayer 2 on the substrate 1 contains a lower multi-layered interconnect structure 90 which is formed in the lower portion thereof, and more closer to the substrate 1, and an upper multi-layered interconnect structure 92 which is formed in the upper portion thereof, over the lower multi-layered interconnect structure 90, and more closer to the bonding pad 72. Between the lower multi-layered interconnect structure 90 and the upper multi-layered interconnect structure 92, there is provided an intermediate via-level insulating interlayer 48 (intermediate insulating film).

The substrate 1 may be configured by a semiconductor substrate, such as a silicon substrate. Although not illustrated in the drawing, the substrate 1 is provided with semiconductor elements such as transistors, resistors and capacitors, and an internal circuit which contains circuit interconnects used for connecting these semiconductor elements. The circuit interconnect may be configured by interconnects formed in any layer in the multi-layered interconnect structure, diffusion layers formed in the substrate 1, and electro-conductive layers typically composed of impurity-diffused polysilicon. In this embodiment, the internal circuit may be provided in a region outside the pad placement region 94, or a part of the internal circuit may be placed in the pad placement region 94 so as to give the circuit-under-pad (CUP) structure. In the circuit-under-pad (CUP) structure, the internal circuit may be provided in the lower multi-layered interconnect structure 90, in the pad placement region 94.

The lower multi-layered interconnect structure 90 is configured by an etching stopper film 13, a lower interconnect-level insulating interlayer 14, a barrier insulating film 17, a lower via-level insulating interlayer 18, a lower interconnect-level insulating interlayer 24, a barrier insulating film 27, a lower via-level insulating interlayer 28, a lower interconnect-level insulating interlayer 34, a barrier insulating film 37, a lower via-level insulating interlayer 38, a lower interconnect-level insulating interlayer 44, and a barrier insulating film 47 stacked in this order.

The lower interconnect-level insulating interlayer 14, the lower interconnect-level insulating interlayer 24, the lower interconnect-level insulating interlayer 34, and the lower interconnect-level insulating interlayer 44 have lower interconnects 15, lower interconnects 25, lower interconnects 35, and lower interconnects 45 respectively formed therein. Each of the lower interconnects 15, the lower interconnects 25, the lower interconnects 35, and the lower interconnects 45 may be configured by a metal film mainly composed of copper, and a barrier metal film 16, a barrier metal film 26, a barrier metal film 36, and a barrier metal film 46 respectively formed in contact with the lower surface and side faces of the metal film. The barrier metal film 16, the barrier metal film 26, the barrier metal film 36, and the barrier metal film 46 may be configured by a material typically containing a refractory metal such as Ta or Ru. In one exemplary case, these barrier metal films may be composed of a Ta-containing stacked film.

The lower via-level insulating interlayer 18, the lower via-level insulating interlayer 28, and the lower via-level insulating interlayer 38 have lower vias 19, lower vias 29, and lower vias 39 respectively formed therein. Similarly to the interconnects, also each of the lower vias 19, the lower vias 29, and the lower vias 39 may be configured by a metal film mainly composed of copper, and a barrier metal film 26, a barrier metal film 36, and a barrier metal film 46, respectively formed in contact with the lower surface and side faces of the metal film. Also these barrier metal films may be configured similarly to the above described barrier metal film such as the barrier metal film 16. Note that the lower vias 19, the lower vias 29, and the lower vias 39, illustrated herein so as to configure the dual-damascene structure, while being integrated respectively with the lower interconnects 25, the lower interconnects 35, and the lower interconnects 45, may alternatively configure the single-damascene structure.

The upper multi-layered interconnect structure 92 is configured by an upper interconnect-level insulating interlayer 54, a barrier insulating film 57, an upper via-level insulating interlayer 58, and an upper interconnect-level insulating interlayer 64 stacked in this order.

The upper interconnect-level insulating interlayer 54 and the upper interconnect-level insulating interlayer 64 have upper interconnects 55 and upper interconnects 65 respectively formed therein. Similarly to the interconnects in the lower multi-layered interconnect structure 90, also each of the upper interconnects 55 and the upper interconnects 65 may be configured by a metal film mainly composed of copper, and a barrier metal film 56 and a barrier metal film 66 respectively formed in contact with the lower surface and side faces of the metal film. The upper via-level insulating interlayer 58 has upper vias 59 formed therein. Also each of the upper vias 59 may be configured by a metal film mainly composed of copper, and a barrier metal film 66 formed in contact with the lower surface and side faces of the metal film. Also the barrier metal film may be configured similarly to the barrier metal film 16. Note that the upper vias 59 illustrated herein so as to configure the dual-damascene structure, while being integrated with the upper interconnects 65, may alternatively configure the single-damascene structure. The upper interconnects 55 and the upper interconnects 65 are connected through the upper vias 59.

The thickness of the barrier metal films in contact with the individual interconnects and the individual vias, contained in the lower multi-layered interconnect structure 90 and the upper multi-layered interconnect structure 92, may be adjusted for example to 3 nm to 20 nm or around. For example in the 32-nm node, each interconnect may give a total thickness, summed up with the thickness of the barrier metal film and the metal film, of 80 nm to 120 nm or around.

The lower interconnect-level insulating interlayer 14, the lower interconnect-level insulating interlayer 24, the lower interconnect-level insulating interlayer 34, and the lower interconnect-level insulating interlayer 44 may be configured by a low-k film material generally adopted, which is exemplified by porous silica, porous SiOC, porous SiOCH, non-porous SiOC or SiOCH, HSQ (hydrogen silsesquioxane), ladder oxide ($L_{ox}$), and amorphous carbon. The thickness of these insulating interlayers may be adjusted typically to 50 nm to 120 nm or around.

Also the upper interconnect-level insulating interlayer 54 and the upper interconnect-level insulating interlayer 64 may be configured using a material similar to that used in the lower interconnect-level insulating interlayers in the lower multi-layered interconnect structure 90. The thickness of the upper interconnect-level insulating interlayer 54 may be adjusted typically to 50 nm to 120 nm or around. The thickness of the upper interconnect-level insulating interlayer 64 may be adjusted typically to 800 nm or around.

The lower via-level insulating interlayer 18, the lower via-level insulating interlayer 28, the lower via-level insulating interlayer 38, the intermediate via-level insulating interlayer 48, and the upper via-level insulating interlayer 58 may be configured by an insulating film material generally adopted, which is exemplified by low-k film materials such as porous silica, porous SiOC, porous SiOCH, non-porous SiOC or SiOCH, HSQ (hydrogen silsesquioxane), ladder oxide ($L_{ox}$), and amorphous carbon; and insulating film materials such as $SiO_2$. The thickness of these insulating interlayers may be adjusted typically to 30 nm to 150 nm or around.

The barrier insulating film 17, the barrier insulating film 27, the barrier insulating film 37, the barrier insulating film 47, the barrier insulating film 57, and the barrier insulating film 67 may be configured typically by SiCN and SiC. The thickness of these insulating films may be adjusted typically to 10 nm to 50 nm or around.

The intermediate via-level insulating interlayer 48 may be configured using a material similar to that used in the lower via-level insulating interlayers in the lower multi-layered interconnect structure 90. The thickness of the intermediate via-level insulating interlayer 48 may be adjusted typically to 30 nm to 800 nm or around.

Over the upper interconnect-level insulating interlayer 64 in the upper multi-layered interconnect structure 92, there are provided a barrier insulating film 67, a via-level insulating interlayer 68, a protective insulating film 73, and a polyimide film 74 stacked in this order. A passivation film is configured by the protective insulating film 73 and the polyimide film 74. The protective insulating film 73 may be configured by a SiCN film, for example.

Note that the polyimide film 74 actually formed over the pad interconnect 75 is made transparent in FIG. 2, for the convenience of explanation. FIG. 2 illustrates a pad inner edge 75a and a pad outer edge 75b of the pad interconnect 75, and an inner edge 74a of the polyimide film 74, and an outer edge 69b of the pad via 69. The outer circumferential portion of the pad via 69 of the bonding pad 72 and the pad interconnect 75 are covered with the polyimide film 74, so that the pad via 69 exposes only in a region specified by the inner edge 74a of the polyimide film 74. The pad inner edge 75a and the pad outer edge 75b of the pad interconnect 75 are covered with the polyimide film 74. As illustrated in FIG. 2, the pad placement region 94 in this embodiment may be a region surrounded by the pad outer edge 75b of the bonding pad 72.

The bonding pad 72 is configured by the pad via 69 and the pad interconnect 75. The pad via 69 and the pad interconnect 75 are configured typically by a metal material mainly composed of aluminum. The thickness of the pad via 69, in the flat portion thereof, may be adjusted typically to 0.8 μm to 2 μm or around. The bonding pad 72 is formed so as to be in contact, while placing in between the barrier metal film 70 formed thereunder, with the upper interconnect 65. The barrier metal film 70 may be configured typically by a material containing a refractory metal such as Ta. For example, the barrier metal film 70 may be configured by using a material containing TiN. The thickness of the barrier metal film 70, in the flat portion thereof, may be adjusted typically to 50 nm to 300 nm or around.

In this embodiment, the upper interconnects 65 and the upper interconnects 55 contained in the upper multi-layered interconnect structure 92 occupy almost the same region with the bonding pad 72 in a plan view. The upper interconnects 65 and the upper interconnects 55 may be formed so as to be distributed over the entire range of the pad placement region 94 in an integrated manner, respectively. In this embodiment, the upper interconnects 65 and the upper interconnects 55 may be configured to have a ratio of area larger than that of a layer having the internal circuit formed therein. In this embodiment, the ratio of area occupied by the interconnects in the upper interconnect-level insulating interlayers contained in the upper multi-layered interconnect structure 92 may be adjusted to 70% or larger. The impact resistance may therefore be improved. The ratio of area occupied by the interconnects in the upper interconnect-level insulating interlayers contained in the upper multi-layered interconnect structure 92 may be adjusted to 95% or smaller. Dishing possibly occurs in the process of chemical mechanical polishing (CMP) for forming the interconnects may therefore be avoidable. The ratio of area (also referred to as "data ratio") herein may be defined as a value obtained by dividing the total area of the interconnects which reside in the pad placement region 94 in a plan view, by the area of the pad placement region (the region surrounded by the pad outer edge 75b in the drawing).

The upper interconnect 65 and the upper interconnect 55 are connected in the pad placement region 94, through the upper vias 59. In other words, the upper multi-layered interconnect structure 92 in this embodiment may be understood as a layer having the interconnects and vias formed therein electrically connected to the bonding pad 72 in the pad placement region 94. The bonding pad 72 herein may be configured so as to be connected to the internal circuit (not illustrated) of the semiconductor device 100, through the upper interconnects 65, the upper vias 59, and the upper interconnects 55.

On the other hand, in the pad placement region 94 in this embodiment, there is no electro-conductive material such as vias, which connects the lower interconnects 45 in the topmost layer of the lower multi-layered interconnect structure 90, with the upper interconnects 55 in the lowermost layer of the upper multi-layered interconnect structure 92. In this embodiment, there is provided the intermediate via-level insulating interlayer 48 between the lower multi-layered interconnect structure 90 and the upper multi-layered interconnect structure 92. In the intermediate via-level insulating interlayer 48, in the pad placement region 94, there is no electro-conductive material which connects the lower interconnects 45 in the topmost layer of the lower multi-layered interconnect structure 90, with the upper interconnects 55 in the lowermost layer of the upper multi-layered interconnect structure 92. In other words, the lower multi-layered interconnect structure 90 in this embodiment may be understood as a layer having the interconnects and vias formed therein not connected to the bonding pad 72 in the pad placement region 94. The lower multi-layered interconnect structure 90 may, however, be configured so that the interconnects and the vias contained therein are electrically connected to the bonding pad 72 through the vias which are formed outside the pad placement region 94.

Although not specifically limited, the ratio of area occupied by the interconnects in the lower interconnect-level insulating interlayers contained in the lower multi-layered interconnect structure 90 may be adjusted typically to 15% or larger. The impact resistance may therefore be improved. The ratio of area occupied by the interconnects in the lower interconnect-level insulating interlayers contained in the lower multi-layered interconnect structure 90 may be adjusted to 95% or smaller. Dishing possibly occurs in the process of chemical mechanical polishing (CMP) for forming the interconnects may therefore be avoidable.

In the thus-configured semiconductor device 100, in the pad placement region 94, the ratio of area occupied by the lower vias in the via-level insulating interlayers contained in the lower multi-layered interconnect structure 90 may be set smaller than the ratio of area occupied by the upper vias 59 in the upper via-level insulating interlayer 58 contained in the upper multi-layered interconnect structure 92. The ratio of area (also referred to as "data ratio") herein may be defined as a value obtained by dividing the total area, on the mask basis, of the vias which reside in the pad placement region 94 in a plan view, by the area of the pad placement region 94 (the region surrounded by the pad outer edge 75b in the drawing).

Figure 3A:
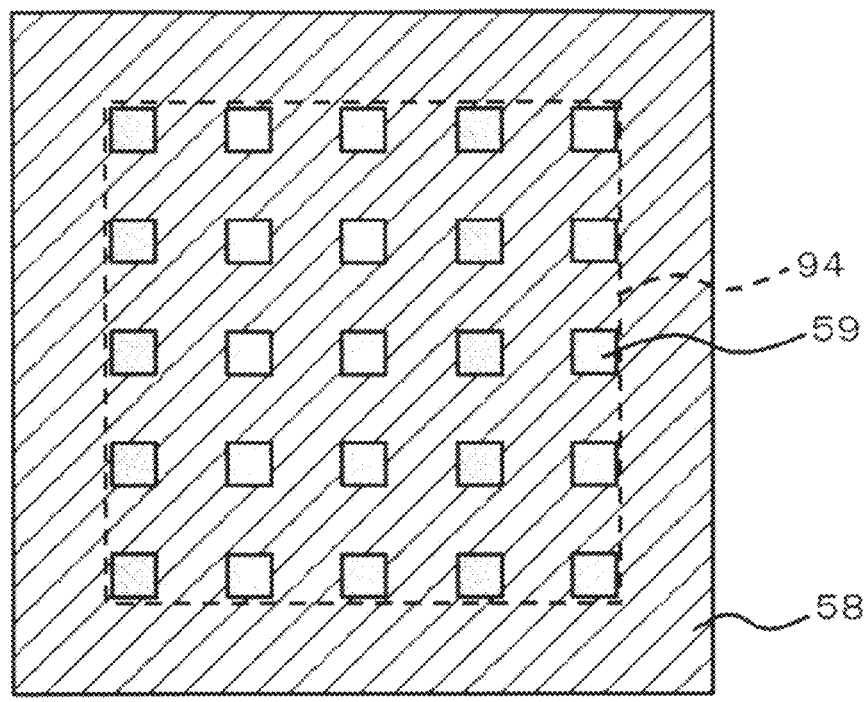
FIGS. 3A and 3B are transverse sectional views of the semiconductor device illustrated in FIG. 1.
Figure 3B:
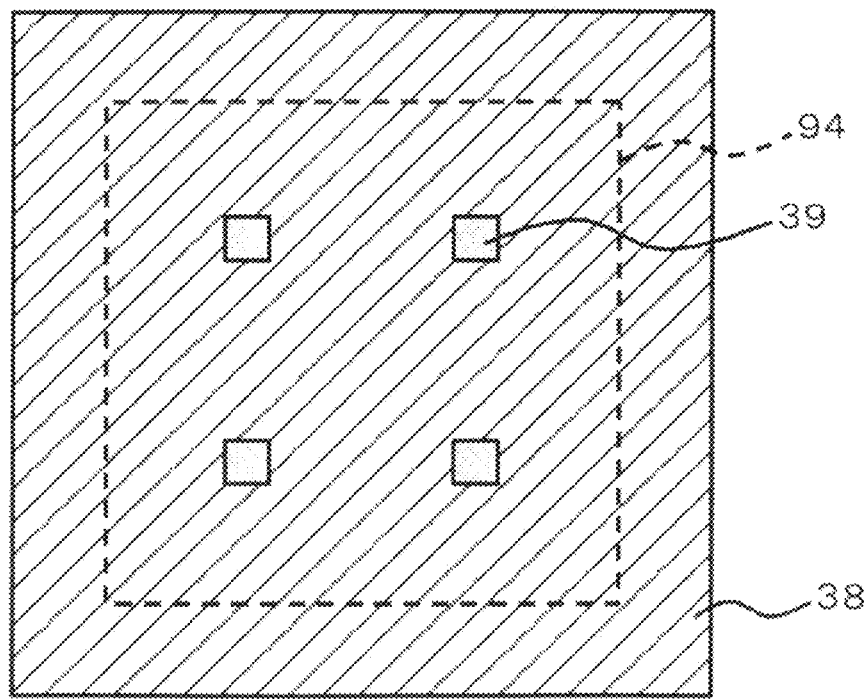

FIG. 3A is a transverse sectional view illustrating an exemplary configuration of the upper via-level insulating interlayer 58 contained in the upper multi-layered interconnect structure 92, and the upper vias 59 formed therein. FIG. 3A corresponds to a sectional view taken along line A-A' in FIG. 1. FIG. 3B is a transverse sectional view illustrating an exemplary configuration of the lower via-level insulating interlayer 38 contained in the lower multi-layered interconnect structure 90, and the lower vias 39 formed therein. FIG. 3B corresponds to a sectional view taken along line B-B' in FIG. 1. The vias in these drawings are schematically illustrated, for easy understanding of the ratio of area occupied by the vias in the individual layers.

As illustrated in FIG. 3A, twenty-five upper vias 59 are arranged in the upper via-level insulating interlayer 58, to form a 5×5 matrix. On the other hand, as illustrated in FIG. 3B, four lower vias 39 are arranged in the lower via-level insulating interlayer 38, to form a 2×2 matrix. Although not illustrated, also in the lower via-level insulating interlayer 28 and in the lower via-level insulating interlayer 18, the ratio of area occupied by the vias in the individual layers may be set smaller than that of the upper via-level insulating interlayer 58, similarly to as in the lower via-level insulating interlayer 38.

FIGS. 3A and 3B illustrate an exemplary case where the upper vias 59 and the lower vias 39 have the same size of opening. For the case where all vias have the same size of opening, each of the lower via-level insulating interlayer 18, the lower via-level insulating interlayer 28, and the lower via-level insulating interlayer 38 may have a smaller number of vias than the upper via-level insulating interlayer 58 has.

By virtue of this configuration, any impact applied to the bonding pad 72 in the process of probing and wire bonding, may be absorbed, and thereby the incidence of separation of the insulating interlayers may be suppressed to a low level. A possible mechanism will be explained below.

Figure 4:
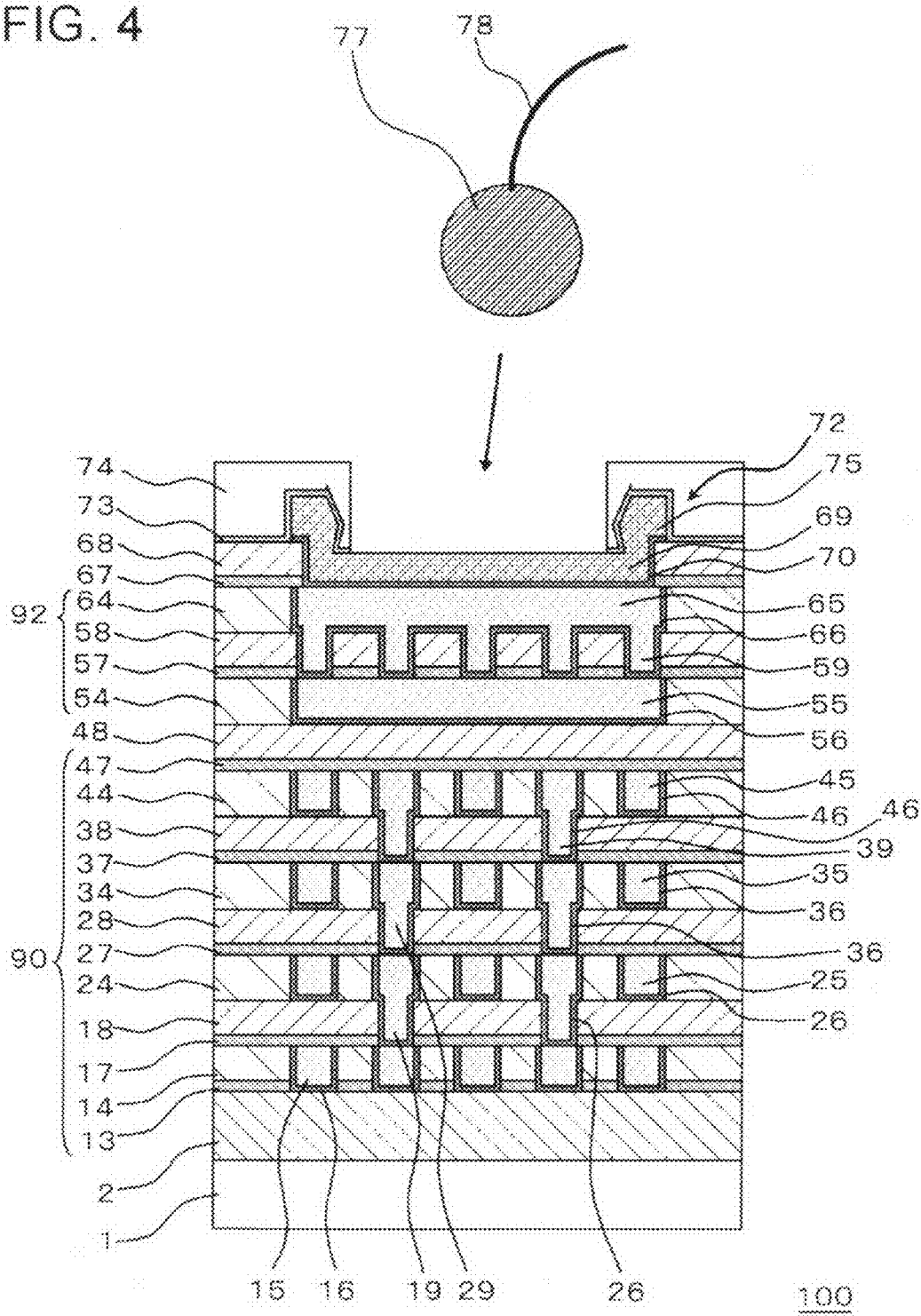
FIG. 4 is a vertical sectional view illustrating a procedure of bonding a bonding wire to a bonding pad of the semiconductor device.

FIG. 4 is a vertical sectional view illustrating a procedure of bonding a bonding wire 78 to the bonding pad 72 of the semiconductor device 100. In the process of wire bonding to the bonding pad 72, a ball 77 formed at the end of the bonding wire 78 is brought into contact with the bonding pad 72, and is bonded to the bonding pad 72, while being applied with load and ultrasonic wave under predetermined conditions. In this process, the bonding pad 72 is applied with load, and impact generates as a consequence.

FIG. 5A is a vertical sectional view schematically illustrating a mode of propagation of impact which generates at the bonding pad 72 into the multi-layered interconnect structure of the semiconductor device 100 of this embodiment.

In this embodiment, the upper interconnects 65 which occupy almost same region with the bonding pads 72 are formed right under the bonding pad 72, as described in the above. Below the upper interconnects 65, there are formed the upper interconnects 55 which occupy almost same region with the bonding pad 72. Between the upper interconnects 65 and the upper interconnects 55, there are provided upper vias 59 having a large ratio of area. As a consequence, the upper interconnects 55, the upper vias 59 and the upper interconnects 65 are configured as if they give a single thick bonding pad. This portion is illustrated as the upper multi-layered interconnect structure 92 in FIG. 5A. Since the interconnects and the vias composed of a film of metal such as copper is larger in the elasticity, which represents a repulsive property against externally applied force, as compared with the insulating interlayers typically composed of an oxide film, so that the upper multi-layered interconnect structure may be improved in the strength, and in the resistance against impact possibly applied in the process of wire bonding, by providing the thus-configured interconnects and vias below the bonding pad 72. Accordingly, the insulating interlayers may be prevented from causing cracks, in the upper portion of the semiconductor device 100.

Below the upper multi-layered interconnect structure 92, there is provided the intermediate via-level insulating interlayer 48 having no electro-conductive material layer formed therein. Accordingly, any impact possibly applied to the bonding pad 72 may be moderated by the intermediate via-level insulating interlayer 48, and thereby the resistance against impact may be improved to a certain extent.

However, a load ascribable to a fraction of the impact applied to the bonding pad 72, which could not fully be absorbed by the upper multi-layered interconnect structure 92 and the intermediate via-level insulating interlayer 48, may occasionally be applied through the intermediate via-level insulating interlayer 48 to the lower multi-layered interconnect structure 90. As a consequence, the lower multi-layered interconnect structure 90 may occasionally cause separation of the films, and deformation of the layer structure.

In view of preventing this sort of separation of the films, it is important to uniformly distribute the load which propagates from the upper portion. By reducing the ratio of area occupied by the vias in the individual via-level insulating interlayers of the lower multi-layered interconnect structure 90, such as in the semiconductor device 100 of this embodiment, an operation of downwardly distributing the load in the process of wire bonding and probing may be expressed in an efficient manner.

By reducing the ratio of area occupied by the vias in the individual via-level insulating interlayers, the load applied from the upper portion may gradually be moderated as it propagates towards the deeper side, and thereby the impact may be absorbed. The separation of the films may be prevented in this way.

On the other hand, for the case where the ratio of area occupied by the vias in the individual via-level insulating interlayers in the lower multi-layered interconnect structure 90 is large, the load applied to the lower multi-layered interconnect structure 90 may directly be allowed to propagate towards the deeper side, only with a small degree of moderation. FIG. 5B illustrates a configuration having a large ratio of area occupied by the vias in the via-level insulating interlayers of the lower multi-layered interconnect structure 90. In this sort of configuration, the load applied to the lower multi-layered interconnect structure 90 may directly be allowed to propagate toward the deeper side, and then concentrated between the lower interconnect 15 in the lowermost layer and the lower vias 19 layer (a portion surrounded by a broken line in the drawing). The insulating interlayer 2 formed between the substrate 1 and the lower interconnect 15, which is the first interconnect layer formed over the substrate 1, is generally composed of a relatively hard insulating film such as silicon oxide film, rather than a low-k film. Also the substrate 1 has a large hardness. For this reason, there is no moderation layer below the lower multi-layered interconnect structure 90, so that the load may not be distributed. If the load is only unsuccessfully distributed as described in the above, separation of the films may occur at a position where the load is concentrated, and the layer structure may deform. As a consequence, the bonding pad 72 may be more likely to cause separation or the like, due to cracks generated in the insulating interlayers in the process of probing and wire bonding, rolling or collision to packing materials during transportation, or impact possibly applied in the process of assembly into the final products.

From another point of view, each lower via-level insulating interlayer contains two types of constituents, that are the vias typically composed of copper having a large Young's modulus, and the insulating interlayers having a small Young's modulus. Existence of two such constituents largely differ in Young's modulus in the same layer, may result in modes of deformation different from place to place, under the load applied downward in the process of probing and wire bonding. For example, the via-level insulating interlayers composed of porous SiOC will have a Young's modulus of approximately 4 GPa. On the other hand, copper has a Young's modulus of approximately 110 GPa. Different modes of deformation may, therefore, occur in the lower via-level insulating interlayers. Under the presence of two such materials largely differ in Young's modulus, the overall Young's modulus of the system may be more assumable as uniform, and thereby the system may be less susceptible to deformation under load, by extremely increasing the compositional ratio of either one of the materials.

In this embodiment, the ratio of area occupied by the vias in each of the lower via-level insulating interlayer 18, the lower via-level insulating interlayer 28, and the lower via-level insulating interlayer 38, which are contained in the lower multi-layered interconnect structure 90, may be adjusted to less than 4%. By the adjustment, the compositional ratio of the insulating film may be increased in each layer, the overall elasticity of the whole layer may be approximated to a uniform value, and thereby the layers may be made less susceptible to deformation under load. As a consequence, cracking of the insulating interlayers in the process of probing and wire bonding, and separation of the insulating films or bonding pad 72 may be avoidable in a more efficient manner.

Figure 6:
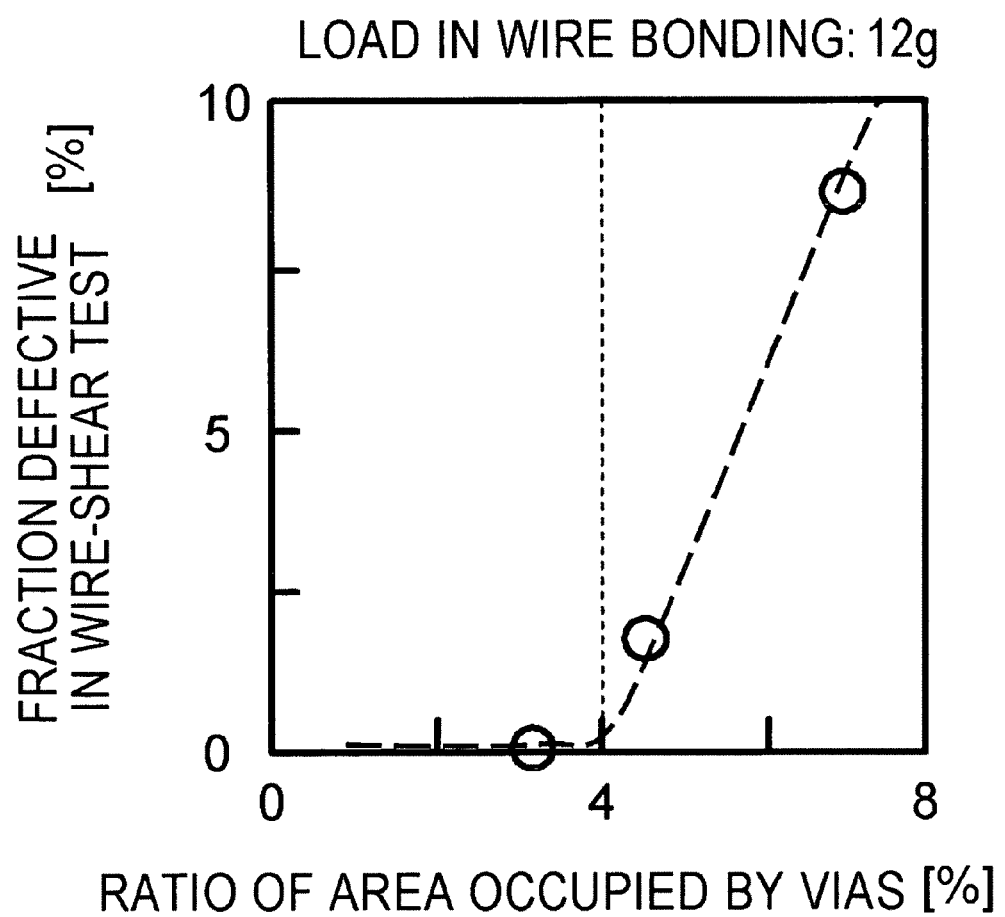
FIG. 6 is a drawing illustrating an effect of the semiconductor device in one embodiment of the present invention.

FIG. 6 is a drawing illustrating a relation between the ratio of area occupied by the vias in the lower interconnect-level insulating interlayers contained in the lower multi-layered interconnect structure 90, in the pad placement region 94 in the configuration illustrated in FIG. 1, and fraction defective in wire-shear test.

In the test, porous SiOC was used for the individual via-level insulating interlayers, and porous silica was used for the individual interconnect-level insulating interlayers. The ratio of area occupied by the upper vias 59 in the upper via-level insulating interlayer 58 contained in the upper multi-layered interconnect structure 92 was set to 20%. The ratio of area occupied by the interconnects in each of the lower interconnect-level insulating interlayers contained in the lower multi-layered interconnect structure 90 was respectively set to 25%, and the ratio of area occupied by the interconnects in each of the upper interconnect-level insulating interlayers contained in the upper multi-layered interconnect structure 92 was respectively set to 88.9%.

The thus-configured semiconductor device 100 was subjected to ball-shear test, in which a probe was hooked on the bonding wire 78 and pulled in the transverse direction. Under an optimized load in the bonding of 12 g, the fraction defective in the ball-shear test was found to be almost zero for a ratio of area occupied by the vias of 3.2%. On the other hand, the fraction defective in the ball-shear test was found to be approximately 2% for a ratio of area occupied by the vias of 4.5%, and the fraction defective was increased up to approximately 8% for a ratio of area of 7.3%. In addition, also under a load of 10 g, which is not an optimized load, the fraction defective in the ball-shear test for a ratio of area occupied by the vias of 3.2%, was reduced to as low as approximately 80% of that attained for a ratio of area occupied by the vias of 7.3%.

In this embodiment, the ratio of area occupied by the vias in the upper via-level insulating interlayer 58 contained in the upper multi-layered interconnect structure 92 may be adjusted to 4% or larger, and more preferably 7% or larger. By adjusting the ratio of area occupied by the vias to 7% or larger, the upper multi-layered interconnect structure 92 may be kept at a sufficient level of strength.

As has been described in the above, according to the configuration of the semiconductor device 100 of this embodiment, the interconnects and the vias, which are connected to the bonding pad 72, are provided in the pad placement region 94 in the upper multi-layered interconnect structure 92. Since the ratio of area occupied by the vias of the layers contained in the upper multi-layered interconnect structure 92 is set to a high level, the upper multi-layered interconnect structure 92 may be improved in the strength, and thereby the insulating interlayer may be prevented from cracking even under load possibly applied in the process of probing and wire bonding.

In addition, the intermediate via-level insulating interlayer 48, having no electro-conductive material layer formed therein, is provided below the upper multi-layered interconnect structure 92. Accordingly, the impact possibly applied to the bonding pad 72 may be moderated by the intermediate via-level insulating interlayer 48, and thereby the resistance against impact may be improved to a certain extent. The individual layers in the pad placement region 94 may therefore be prevented from being deformed, and thereby the bonding pad 72 may be prevented from separating.

Since the ratio of area occupied by the vias is set to a low level in the lower multi-layered interconnect structure 90 formed below the intermediate via-level insulating interlayer 48, so that the impact applied to the bonding pad 72, but not sufficiently absorbed by the upper multi-layered interconnect structure 92 and the intermediate via-level insulating interlayer 48, may gradually be absorbed by the insulating interlayers as it propagates towards the deeper side. Accordingly, the incidence of separation of the insulating interlayers and the pads may be suppressed to a low level, and thereby yield of the final products may be improved.

When the product is inspected before being shipped by probing, a probe used for the probing is brought into contact with the bonding pad 72. The product according to the present invention is sufficiently strong against the impact possibly applied thereto, so that the insulating interlayers below the bonding pad 72 may be prevented from cracking.

Since the ratio of area occupied by the vias in the lower via-level insulating interlayer contained in the lower multi-layered interconnect structure 90 is small, the above-described effects may be obtainable also for the case where a part of the internal circuit is formed in the pad placement region 94 so as to give the circuit-under pad (CUP) structure, without adversely affecting a layout of interconnects of the internal circuit.

Next, modified examples of the semiconductor device 100 of this embodiment will be explained.

FIGS. 7A and 7B are schematic drawings illustrating modified examples of the semiconductor device 100 illustrated in FIG. 5A. While the example illustrated in FIG. 5A was the case where the individual lower via-level insulating interlayers contained in the lower multi-layered interconnect structure 90 have the same ratio of area occupied by the vias, they may alternatively have different ratios of area.

In the examples illustrated in FIGS. 7A and 7B, the ratio of area occupied by the vias of the individual lower via-level insulating interlayers contained in the lower multi-layered interconnect structure 90, is largest in the lower via-level insulating interlayer 18 (an insulating interlayer having the vias 19 formed therein), lowermost of all. As has been explained referring to FIG. 5B, since there is no moderation layer below the lower multi-layered interconnect structure 90, so that the load cannot be moderated below the lower multi-layered interconnect structure 90. If the lower interconnect 15 sinks downward, the layer structure may not be compressed, and may therefore deform. The lower via-level insulating interlayer 18 may therefore be configured to have a large ratio of area occupied by the vias, to thereby keep a sufficient level of strength. Even with this configuration, the ratio of area occupied by the vias in the lower via-level insulating interlayer 18 is kept still smaller than that in the upper via-level insulating interlayers of the lower multi-layered interconnect structure 90 similarly to as described in the above, so that the lower multi-layered interconnect structure 90 may retain an effect of absorbing the impact.

In the configuration illustrated in FIG. 7A, the ratio of area occupied by the vias is set smaller in a layer at a higher level of height. FIG. 8 is a drawing illustrating an exemplary configuration of the semiconductor device 100 corresponded to this sort of configuration. By virtue of this configuration, the load applied to the upper multi-layered interconnect structure 92 may gradually be moderated downwardly from the upper portion.

Figure 9:
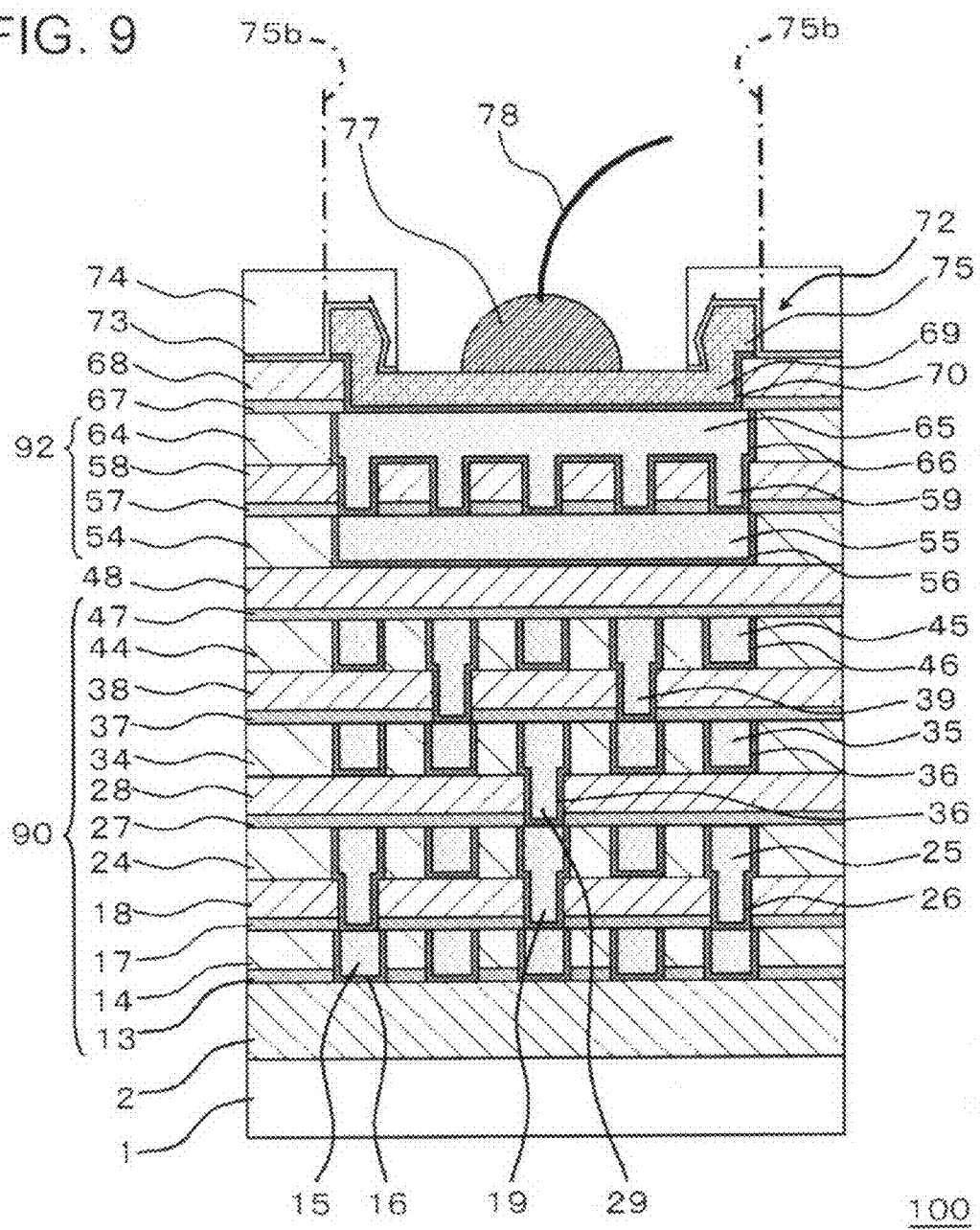

In the configuration illustrated in FIG. 7B, the ratio of area occupied by the vias is minimized in the lower via-level insulating interlayer 28 (the insulating interlayer having the vias 29 formed therein) in the middle of the structure. FIG. 9 is a drawing illustrating an exemplary configuration of the semiconductor device 100 corresponded to this sort of configuration. By virtue of this configuration, the load applied to the lower multi-layered interconnect structure 90 and force exerted back thereon from the lower interconnect 15 may be moderated by the layer (the lower via-level insulating interlayer 28) in the middle of the structure.

Figure 10:
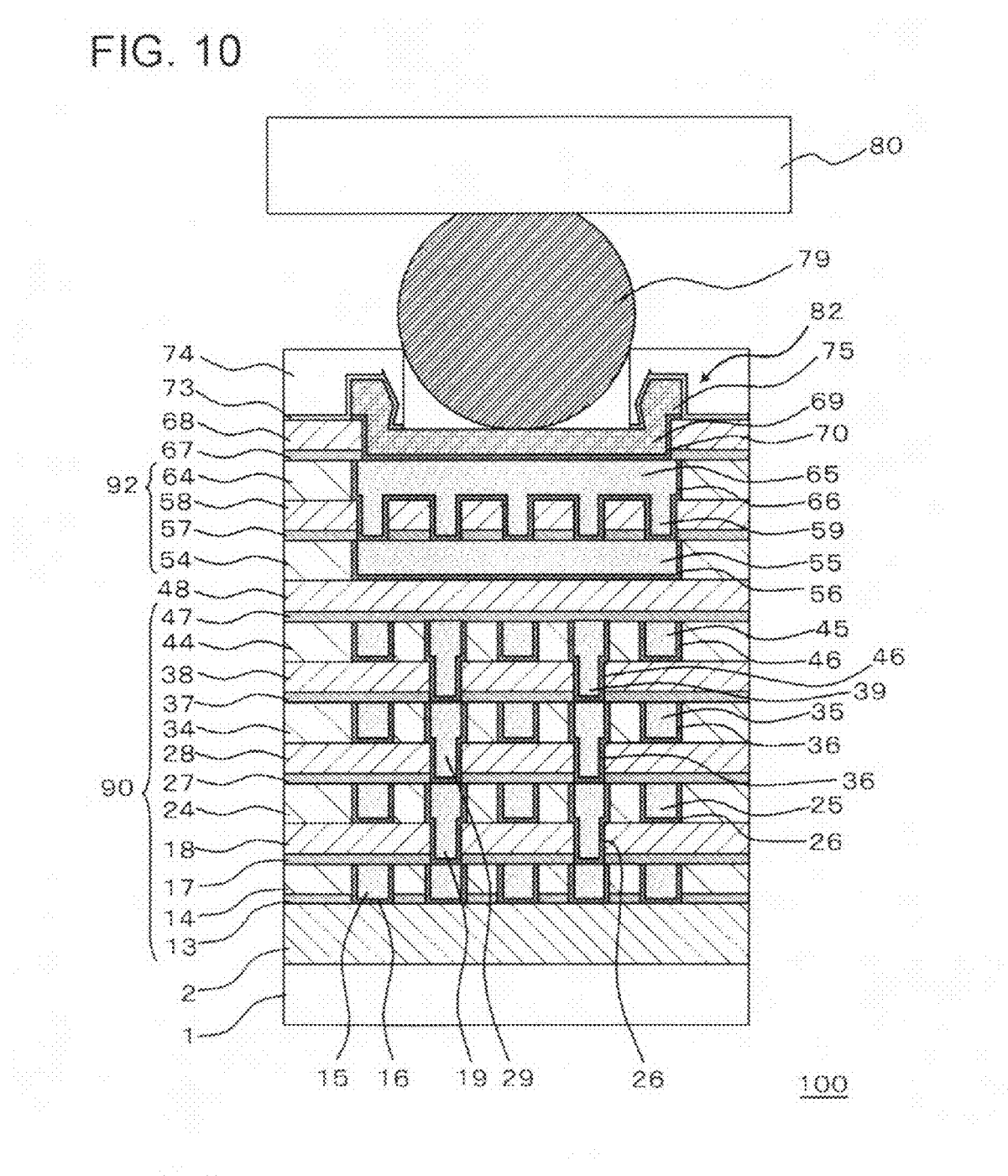

FIG. 10 is a vertical sectional view illustrating a configuration in which the semiconductor device 100 of this embodiment is connected through a bump 79 to an interconnect substrate 80 by flip-chip bonding.

The semiconductor device 100 herein has a pad 82 in place of the bonding pad 72 illustrated in FIG. 1. The pad 82 is configured by a pad via 69 and a pad interconnect 75, similarly to as the bonding pad 72. The pad via 69 and the pad interconnect 75 may be configured by a pad material generally used for flip-chip bonding, such as a metal material mainly composed of aluminum or copper. The bump 79 may be configured by a bump material generally used for flip-chip bonding, such as gold, gold/nickel alloy, solder or the like. Other aspects of the configuration may be same as those of the semiconductor device 100 illustrated in FIG. 1.

Also in this configuration, the pad 82 may be applied with impact when the pad 82 of the semiconductor device 100 and the interconnect substrate 80 are bonded while placing the bump 79 in between. Since the semiconductor device 100 of this embodiment is configured to moderate the impact as described in the above, so that the incidence of separation of the insulating interlayers and the bump may be suppressed to a low level, and thereby yield of the final products may be improved.

The embodiment of the present invention has been described in the above, referring to the attached drawings, merely for exemplary purposes, while allowing adoption of any other configurations other than those described in the above.

For example, while this embodiment exemplifies a case where the upper multi-layered interconnect structure 92 contains two layers of interconnect, and the lower multi-layered interconnect structure 90 contains four layers of interconnect, totals seven layers of interconnect including the pad interconnect of the bonding pad 72, the number of layers of interconnect in the individual structures may appropriately be modified.

Although not illustrated nor described in the embodiment described in the above, there may occasionally be provided, over the insulating layers having the interconnects or vias formed therein, a cap insulating film for the purpose of protection in the process of chemical mechanical polishing. A part of the insulating interlayers contained in the lower multi-layered interconnect structure 90 may be a film other than low-k film, and a part of the insulating interlayers used for the upper multi-layered interconnect structure 92 may be a low-k film, wherein both cases may appropriately be combined.

It may still be allowable, for example, to set the pitch of the lower vias in the lower via-level insulating interlayers contained in the lower multi-layered interconnect structure 90, wider than the pitch of the upper vias in the upper via-level insulating interlayers contained in the upper multi-layered interconnect structure 92.

It is apparent that the present invention is not limited to the above embodiment, that may be modified and changed without departing from the scope and spirit of the invention.

What is claimed is:

1. A semiconductor device comprising:
a substrate;
a multi-layered interconnect structure formed over said substrate, and comprising a plurality of insulating interlayers, the plurality of insulating interlayers including at one insulating interlayer comprising a low-k film; and
a pad formed over said multi-layered interconnect structure formed over said substrate,
wherein said multi-layered interconnect structure further comprises:
a lower multi-layered interconnect structure comprising:
a first interconnect-level insulating interlayer which comprises a first interconnect formed in a region overlapped with said pad in a plan view; and
a first via-level insulating interlayer which comprises a first via formed in the region overlapped with said pad in a plan view;
an upper multi-layered interconnect structure comprising: a second interconnect-level insulating interlayer which comprises a second interconnect formed in the region overlapped with said pad in plan view; and
a second via-level insulating interlayer which comprises a second via formed in the region overlapped with said pad in a plan view, the upper multi-layered interconnect structure being formed over said lower multi-layered interconnect structure; and
an intermediate insulating film formed between said lower multi-layered interconnect structure and said upper multi-layered interconnect structure,
wherein, in the region overlapped with said pad in a plan view, said second interconnect and said second via in said upper multi-layered interconnect structure are formed so as to be electrically connected with said pad,
wherein, in said region overlapped with said pad in plan view, said intermediate insulating film comprises other than an electro-conductive material layer which connects said second interconnect or said second via in said upper multi-layered interconnect structure, with said first interconnect or said first via in said lower multi-layered interconnect structure, and
wherein, in said region overlapped with said pad in plan view, a ratio of an area occupied by said first via in said first via-level insulating interlayer contained in said lower multi-layered interconnect structure, is smaller than a ratio of an area occupied by said second via in said second via-level insulating interlayer contained in said upper multi-layered interconnect structure.

2. The semiconductor device as claimed in claim 1, wherein said lower multi-layered interconnect structure includes at least one of said via-level insulating interlayer comprising said low-k film.

3. The semiconductor device as claimed in claim 1, wherein said low-k film is comprises a porous film.

4. The semiconductor device as claimed in claim 2, wherein said low-k film comprises a porous film.

5. The semiconductor device as claimed in claim 1, wherein, in said region overlapped with said pad in plan view, the ratio of the area occupied by said first via in said first via-level insulating interlayer contained in said lower multi-layered interconnect structure is smaller than 4%.

6. The semiconductor device as claimed in claim 1, wherein, in said region overlapped with said pad in plan view, the ratio of the area occupied by said second via in said second via-level insulating interlayer contained in said upper multi-layered interconnect structure is 7% or larger.

7. The semiconductor device as claimed in claim 1, wherein, in said region overlapped with said pad in plan view, a ratio of an area occupied by said second interconnect in said second interconnect-level insulating interlayer contained in said upper multi-layered interconnect structure is 70% or larger.

8. The semiconductor device as claimed in claim 1, wherein, said lower multi-layered interconnect structure comprises a plurality of via-level insulating interlayers including said first via-level insulating interlayer, and wherein, in said region overlapped with said pad in plan view, a ratio of an area occupied by a plurality of vias included in a via-level insulating interlayer that is closest to said substrate, among said plurality of via-level insulating interlayers of said lower multi-layered interconnect structure, is larger than a ratio of an area occupied by a plurality of vias in via-level insulating interlayers other than the via-level insulating interlayer closest to said substrate.

9. The semiconductor device as claimed in claim 1, wherein the second interconnect forms the electrical connection with the pad.

10. The semiconductor device as claimed in claim 1, wherein the second interconnect-level insulating interlayer comprises an uppermost layer of the upper multi-layer interconnect structure.

11. The semiconductor device as claimed in claim 1, wherein the first interconnect-level insulating interlayer comprises a thickness of approximately 50 nm to 120 nm.

12. The semiconductor device as claimed in claim 1, wherein the second interconnect-level insulating interlayer comprises a thickness of approximately 50 nm to 120 nm.

13. The semiconductor device as claimed in claim 1, wherein the upper multi-layered interconnect structure comprises a plurality of interconnect-level insulating interlayers each of which comprise an interconnect formed in the region overlapped with the pad in plan view.

14. The semiconductor device as claimed in claim 13, wherein the second interconnect-level insulating interlayer comprises a thickness of approximately 50 nm to 120 nm, and a third interconnect insulating interlayer of the plurality of interconnect-level insulating interlayers comprises a thickness of approximately 800 nm.

15. The semiconductor device as claimed in claim 13, wherein, in the region overlapped with the pad in plan view, a ratio of an area occupied by the second interconnect and a third interconnect of a third interconnect-level insulating interlayer of the plurality of interconnect-level insulating layers in the upper multi-layered interconnect structure is approximately 95% or less.

16. The semiconductor device as claimed in claim 1, wherein the intermediate insulating film comprises a thickness of approximately 30 nm to 800 nm.

17. The semiconductor device as claimed in claim 1, wherein the lower multi-layered interconnect structure comprises a plurality of via-level insulating interlayers and each via-level insulating interlayer of the plurality of via-level insulating interlayers comprises fewer vias than a number of vias of the second via-level insulating interlayer.

18. The semiconductor device as claimed in claim 1, wherein, when a load is applied to the upper multi-layered interconnect structure, the load is uniformly distributed through the lower multi-layered interconnect structure.

19. The semiconductor device as claimed in claim 1, wherein the lower multi-layered interconnect structure further comprises a plurality of via-level insulating interlayers including:

an uppermost interconnect insulating interlayer including a first number of vias;

the first via-level insulating interlayer including a second number of vias; and a lowermost interconnect insulating interlayer including a third number of vias, and wherein the first number of vias is less than the second number of vias, and the second number of vias is less than the third number of vias.

20. The semiconductor device as claimed in claim 1, wherein the lower multi-layered interconnect structure further comprises a plurality of via-level insulating interlayers including:

an uppermost interconnect insulating interlayer including a first number of vias;

the first via-level insulating interlayer including a second number of vias; and a lowermost interconnect insulating interlayer including a third number of vias, and wherein the first number of vias is less than the third number of vias and greater than the second number of vias.

* * * * *